United States Patent [19]

Shintai

[11] Patent Number: 5,202,753
[45] Date of Patent: Apr. 13, 1993

[54] RESIN-SEALED SEMICONDUCTOR DEVICE

[75] Inventor: Akira Shintai, Oobu, Japan

[73] Assignee: Nippondenso Co., Ltd., Kariya, Japan

[21] Appl. No.: 766,347

[22] Filed: Sep. 27, 1991

[30] Foreign Application Priority Data

Nov. 26, 1990 [JP] Japan ................... 2-324872

[51] Int. Cl.$^5$ .................... H01L 23/30; C08L 91/00
[52] U.S. Cl. ............................ 257/787; 524/609; 523/443; 257/788; 257/789; 257/793; 257/795
[58] Field of Search ................. 357/72, 85, 74, 68

[56] References Cited

U.S. PATENT DOCUMENTS

| | | | |
|---|---|---|---|
| 3,492,157 | 1/1970 | Shintaro Ito et al. | 357/72 |
| 3,751,724 | 8/1973 | McGrath et al. | 357/72 |
| 4,282,136 | 8/1981 | Hunt et al. | 357/72 |
| 4,337,182 | 6/1982 | Needham | 357/72 |
| 4,965,660 | 10/1990 | Ogihara et al. | 357/72 |
| 5,015,675 | 5/1991 | Walles et al. | 357/72 |

FOREIGN PATENT DOCUMENTS

| | | |
|---|---|---|
| 62-240313 | 10/1967 | Japan . |
| 57-212225 | 12/1982 | Japan . |
| 61-76587 | 4/1986 | Japan . |
| 63-15449 | 1/1988 | Japan . |
| 63-183915 | 7/1988 | Japan . |

Primary Examiner—Eugene R. LaRoche
Assistant Examiner—Viet Q. Nguyen
Attorney, Agent, or Firm—Cushman, Darby & Cushman

[57] ABSTRACT

A resin-sealed semiconductor device, including a lead frame. A semiconductor chip is formed on the lead frame and is electrically connected with the lead frame. At least a part of the lead frame and the semiconductor chip are sealed with a theremosetting resin which includes a base resin, aluminum oxide and fused silica. Stress acting on the semiconductor chip is reduced because the thermal expansion coefficient of the thermosetting resin becomes low due to the fused silica. At the same time the thermal conductivity of the thermosetting resin is increased because of the aluminum oxide.

3 Claims, 5 Drawing Sheets

RESIN-SEALED SEMICONDUCTOR DEVICE

BACKGROUND OF THE INVENTION

1. Field of the Invention

The present invention relates to a resin-sealed semiconductor device in which a semiconductor chip is sealed with a resin.

2. Description of the Related Art

In a conventional automotive resin-sealed semiconductor device, a pair of silicon chips are integrally molded with a resin so as to minimize the size of the resin-sealed semiconductor device. A first chip carries a power transistor for driving an electric load, and the second chip has a control circuit for controlling the power transistor. When the power transistor is designed to control high power loads, the molding resin must have good thermal conductivity because the power transistor becomes hot. Moreover, when the size of the second silicon chip is large, the molding resin needs to have a low stress.

One conventional molding resin uses fused silica or crystal silica as a filler. However, such resin can not be mixed to have both good thermal conductivity and low stress at the same time. If the molding resin has a low thermal conductivity, the chip will overheat. If the resin has relatively high stress, the passivation film formed on the silicon chip will be easily cracked. In either case, the semiconductor devices will be susceptible to break down. Consequently, the reliability of the semiconductor device is significantly reduced.

Japanese unexamined Patent Publication No. 63-183915 and Japanese unexamined Patent Publication No. 62-240313 disclose a resin including aluminum oxide as a filler to increase the thermal conductivity of the resin. However, even such a resin does not sufficiently reduce the stress of the resin semiconductor device.

SUMMARY OF THE INVENTION

Accordingly, it is an objective of the present invention to provide a resin-sealed semiconductor device sealed with a resin having good thermal conductivity and low stress at the same time.

To achieve the foregoing and other objects and in accordance with the purpose of the present invention, a resin-sealed semiconductor device is disclosed which includes a lead frame. A semiconductor chip is formed on the lead frame and is electrically connected with the lead frame. At least a part of the lead frame and the semiconductor chip are sealed with a thermosetting resin which includes a base resin, aluminum oxide and fused silica.

According to the present invention, stress acting on the semiconductor chip is reduced because the thermal expansion coefficient of the thermosetting resin becomes low due to the fused silica. At the same time, the thermal conductivity of the thermosetting resin is high because of the aluminum oxide.

In a preferred embodiment, the relationship between a volume percentage x of the aluminum oxide and a volume percentage y of the fused silica is defined as follows, $1.06x + y > 0.57$ When the relationship between x and y is $1.06x + y > 0.57$, the stress is considerably reduced even given the same thermal conductivity.

In a preferred embodiment, the corner angle of the aluminum oxide is more than 90°.

When the corner angle of the aluminum oxide is more than 90°, the amount of abrasion of a die is reduced.

BREIF DESCRIPTION OF THE DRAWINGS

The feature of the present invention that are believed to be novel are set forth with particularity in the appended claims. The invention, together with the objects and advantages thereof, may best be understood by reference to the following description of the presently preferred embodiments together with the accompanying drawings in which:

DETAILED DESCRIPTION OF THE PREFERRED EMBODIMENTS

The present invention will be described below in greater details with reference to certain preferred embodiment shown in the accompanying drawings.

Figure 1:
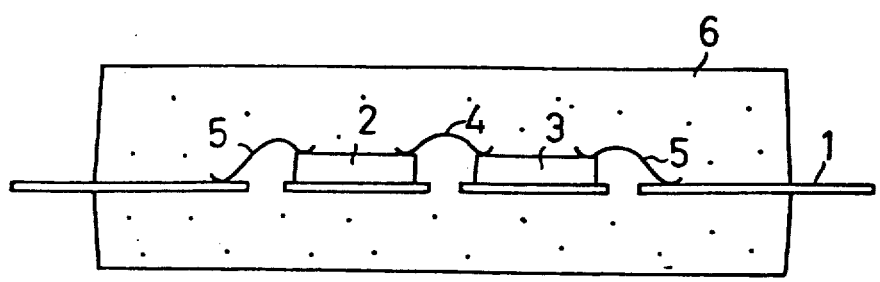
FIG. 1 is a sectional view of a resin-sealed semiconductor device of a preferred embodiment.

As shown in FIG. 1, a first silicon chip 2 and a second silicon chip 3 are bonded to a lead frame 1. A power transistor is formed in the chip 2. A control circuit is formed in the chip 3. The chips 2 and 3 are each covered with a passivation film (not shown). The chips 2 and 3 are electrically connected with each other by a bonding wire 4 and are electrically connected with the lead frame 1 respectively by bonding wires 5. The chips 2 and 3 are integrally sealed with a molding resin 6. The base resin of the molding resin 6 is essentially composed of an epoxy resin, a phenol resin and an epoxy resin modified with silicone. Aluminum oxide ($Al_2O_3$) and fused silica are mixed with the base resin in the molding resin 6 as fillers. The molding resin 6 is a thermosetting resin. It is preferable that a volume percentage of the aluminum oxide is more than 40% by volume, and a volume percentage of the fused silica is more than 10% by volume.

The process of manufacturing the resin-sealed semiconductor device of the present embodiment will be described. Powder of the base material is first mixed with powder of the fillers, aluminum oxide and fused silica. The lead frame 1 is set in a die of a transfer molding machine, wherein the chips 2 and 3 have already been bonded to the lead frame 1. The mixed powder is put in a pot and is melted. The melted resin is then injected into the die. The melted resin in the die is then hardened by heat treatment. Thereafter the resin-sealed semiconductor device is removed from the die.

Generally speaking, when a silicon chip is sealed with a resin including a filler, stress acting on the silicon chip and the thermal conductivity of the molding resin 6 change in accordance with the property of the filler and the quantity of the filler. The thermal expansion coefficient of the silicon chip is $3\times 10^{-6}/°$ C. The thermal expansion coefficient of the resin which does not include the filler is $70\times 10^{-6}/°$ C. The thermal expansion coefficient of fused silica is $0.5\times 10^{-6}$. As the quantity of the mixed filler is increased, the thermal expansion coefficient of the resin which includes the filler increases and becomes more like that of the silicon chip because the thermal expansion coefficient of the fused silica is lower than that of the resin which does not include the filler. Therefore, the stress acting on the silicon chip is reduced.

However, because the thermal conductivity of the fused silica is 3.3 $10^{-3}$cal/cm° Cs (1.4W/m° c. in SI unit), and is lower than that of the crystal silica which is the filler of the conventional resin, the thermal conductivity can not be increased.

The thermal expansion coefficient of aluminum oxide or silicon nitride is higher than that of fused silica. Therefore, such fillers do not reduce the stress of the resin, they do, however, improve the thermal conductivity of the resin.

When nitrides and magnesium oxide are used as fillers they tend to decomposed by exposure to steam, and thus the speed of deterioration of the resin is quickened. Therefore, such fillers are not suitable for molding a semiconductor chip. On the contrary, the aluminum oxide is sufficiently stable in the presence of steam, and is suitable for molding the semiconductor chip.

Figure 2:
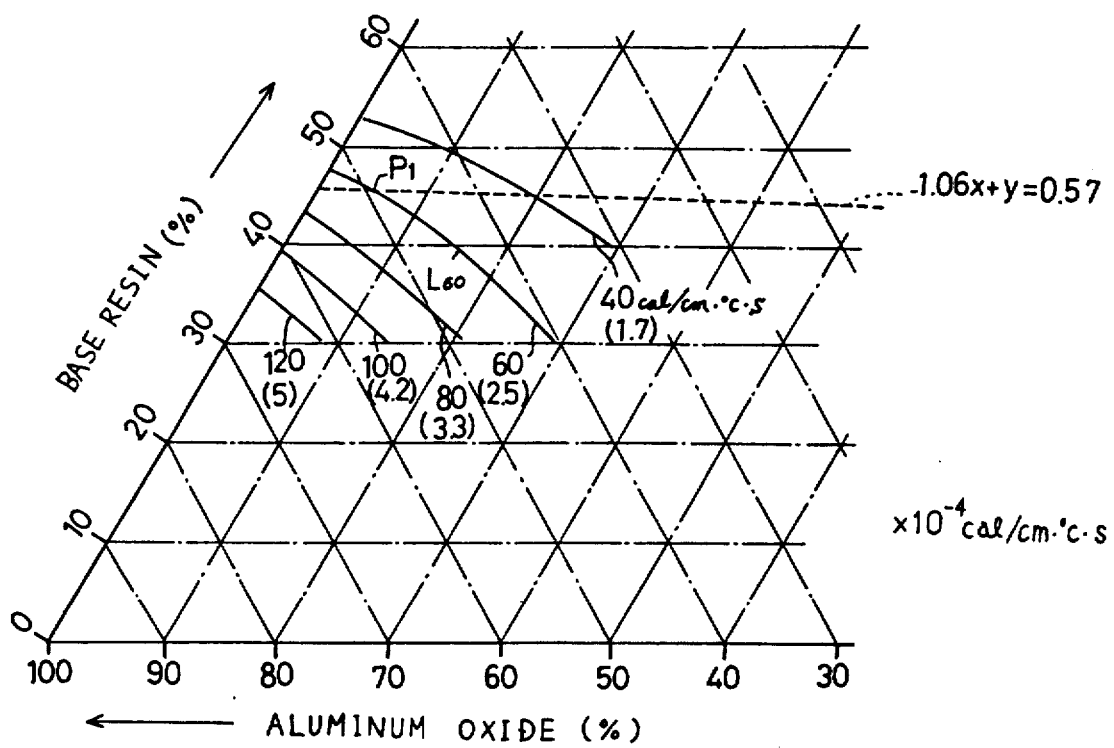
FIG. 2 is the triangular coordinate graph showing the thermal conductivity characteristics of various sealing resin compositions as a function of base resin, aluminum oxide and fused silica content.

FIG. 2 is a triangular coordinate graph showing thermal conductivity of the molding resin 6 as a function of its, specifically it shows various percentages of the base resin, percentages of the aluminum oxide and the fused silica. As shown in FIG. 2, the characteristics of the thermal conductivity of the molding resin 6 increase in accordance with increasing of contents of the aluminum oxide by percentage and nearly linear. The reason why is that the thermal conductivity of the molding resin 6 is determined primarily by the fillers. It is noted that value in parentheses are represented in SI unit, W/mk, in FIG. 2.

Figure 3:
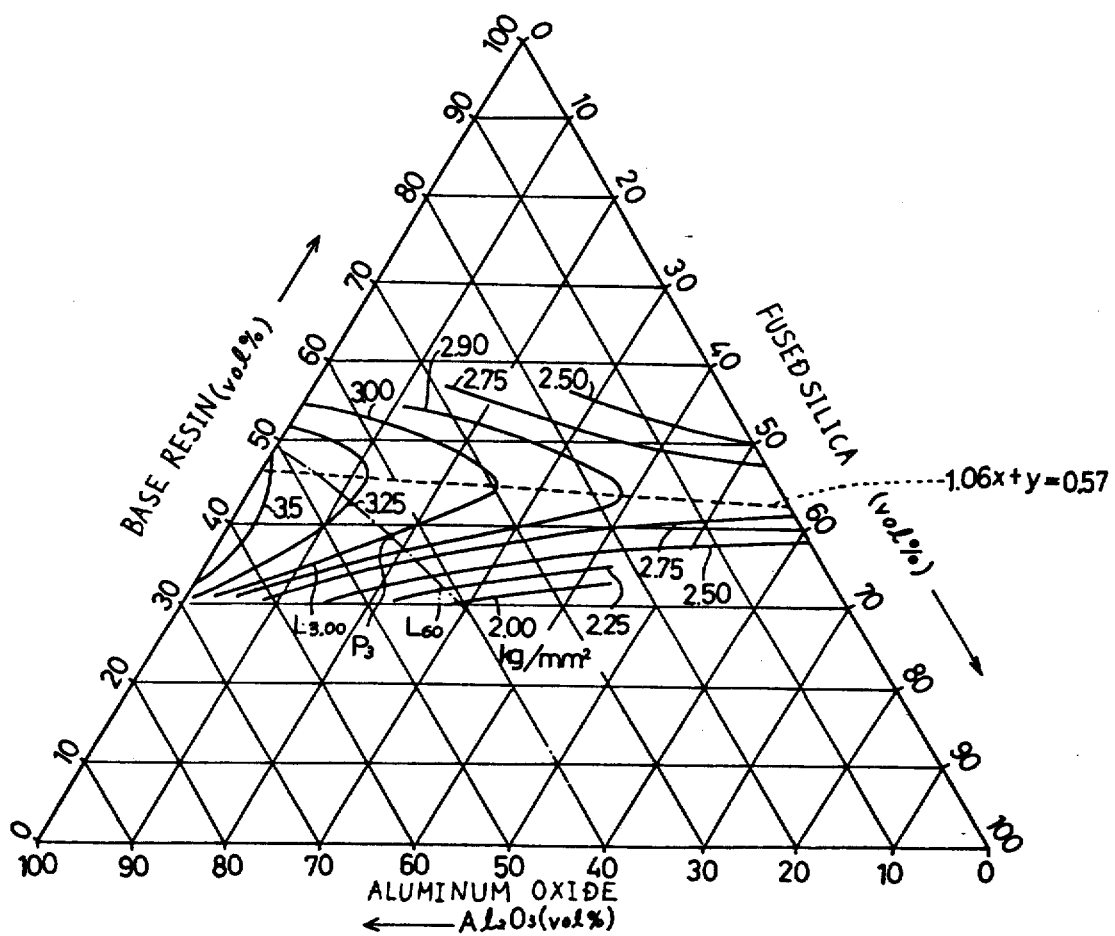
FIG. 3 is the triangular coordinate graph showing the stress characteristics of various sealing resin compositions as a function of the base resin, the aluminum oxide and the fused silica content.

FIG. 3 is a graph using triangular coordinate system that shows the relationship between the composition of the molding resin 6 and the stress acting on the chips 2 and 3. As shown in FIG. 3, is stress lines are not linear and are folded. The reason why is that the stress changes in accordance with the product of the thermal expansion coefficient multiplied by the modulus of elasticity of the molding resin. The thermal expansion coefficient of the molding resin decreases in accordance with increasing of content of the fillers by percentage. In contrast, the modulus of elasticity of the molding resin increases in accordance with increasing of content of the fillers by percentage. The original behavior of the molding resin including the aluminum oxide and the fused silica has been found by the present inventor. The behavior is that, when the volume percentage (vol.%) of the base resin is more than approximately 45 vol.%, the stress increases in accordance with increasing of content of the fillers by percentage, and when the volume percentage is less than approximately 45 vol.%, the stress decreases in accordance with decreasing of content of the aluminum oxide and increasing of content of the fused silica by percentage. A dotted line in FIG. 3 links peaks of the isostress lines and is represented by the following equation:

$$1.67x + y = 0.57$$

wherein $x$ denotes the volume percentage of the aluminum oxide, and $y$ denotes the volume percentage of the fused silica.

As understood from FIGS. 2 and 3, when the relationship between x and y is $1.06x + y \leq 0.57$, the lines of the thermal conductivity shown in FIG. 2 are approximately parallel to the isostress lines shown in FIG. 3, and when the relationship between x and y is $1.06 + y > 0.57$, the lines of the thermal conductivity cross the isostress lines at an approximately right angle. Therefore, when the relationship between x and y is $1.06x + y > 0.57$, the stress is considerably reduced even if the same thermal conductivity by decreasing of content of the aluminum oxide and increasing of content of the fused silica by percentage.

The reason why the above-mentioned behavior happens is that the modulus of elasticity of the aluminum oxide is more than five times higher than that of the fused silica. When the volume percentage of the aluminum oxide is high, the degree of increment of the modulus of elasticity of the molding resin 6 is higher than degree of decrement of the thermal expansion coefficient. Therefore, the stress acting on the chips 2 and 3 are increased as a whole.

When a designer determined volume percentages of the aluminum oxide and the fused silica at the initial design so that the thermal conductivity of the molding resin 6 is, for example, 60 $10^{-4}$cal/cm° Cs, the designer first determines the composition of the molding resin 6 along the line L60 of the thermal conductivity shown in FIG. 2. In this case, when the volume percentage of the aluminum oxide is poorer than the point P1 on the line L60, the relationship between x and y is the range of $1.06x + y > 0.57$. Therefore, the thermal expansion coefficient of the molding resin 6 can be less than a certain value in the range, and the stress acting on the chips 2 and 3 is considerably reduced along the line L60.

Moreover, when the designer determines the volume percentages of the aluminum oxide and the fused silica at the initial design so that the stress acting on the silicon chips 2 and 3 is, for example, 3.00 Kg/mm², the designer determines the composition of the molding resin 6 along the isostress line L3.00 shown in FIG. 3.

Therefore, when the designer determines the volume percentages at the inital design so that the thermal conductivity is 60 $10^{-4}$cal/cm° Cs and the stress is 3.00 Kg/mm², the designer determines the composition of the molding resin 6 at the intersection P3 of the lines L60 and L3.00.

Figure 4:
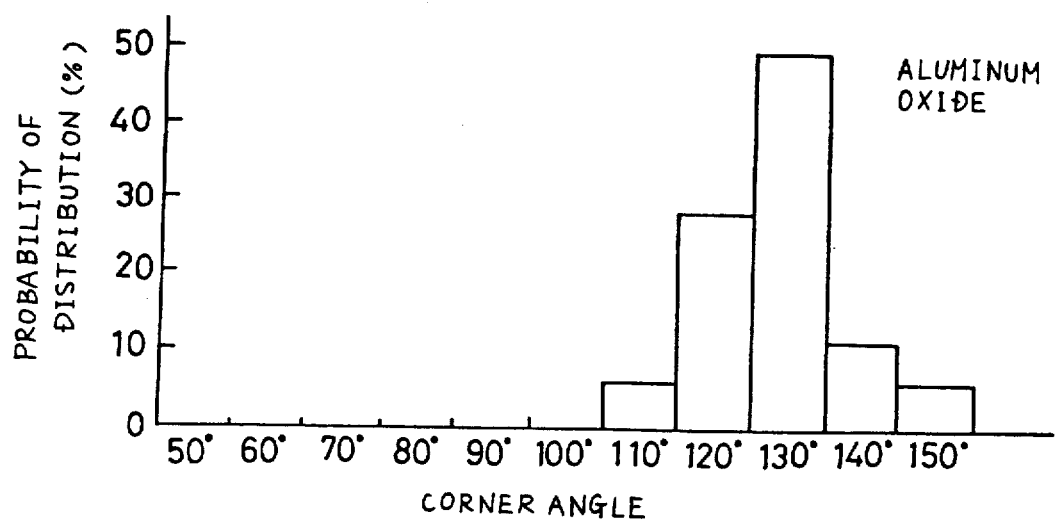
FIG. 4 shows the relationship between a corner angle of aluminum oxide and the probability of distribution.
Figure 5:
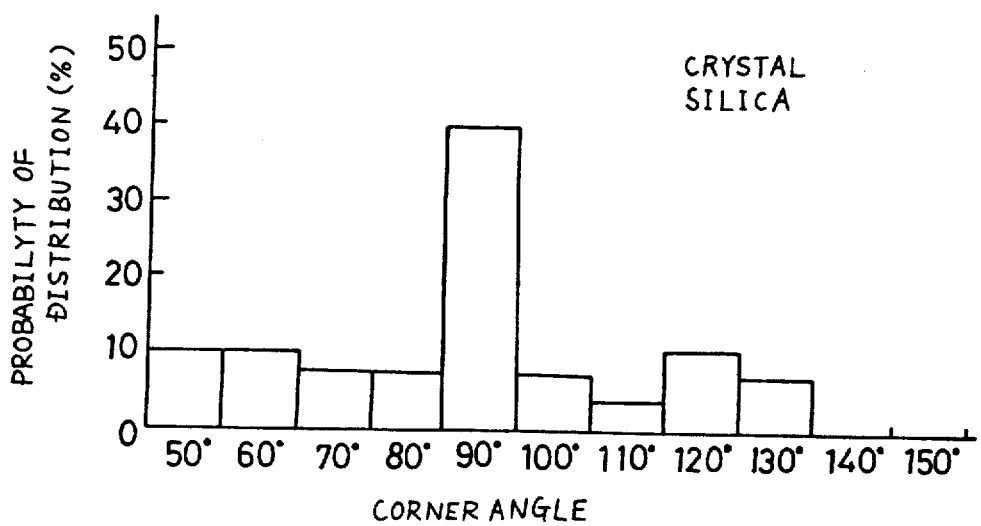
FIG. 5 shows the relationship between a corner angle of crystal silica and the probability of distribution.
Figure 6:
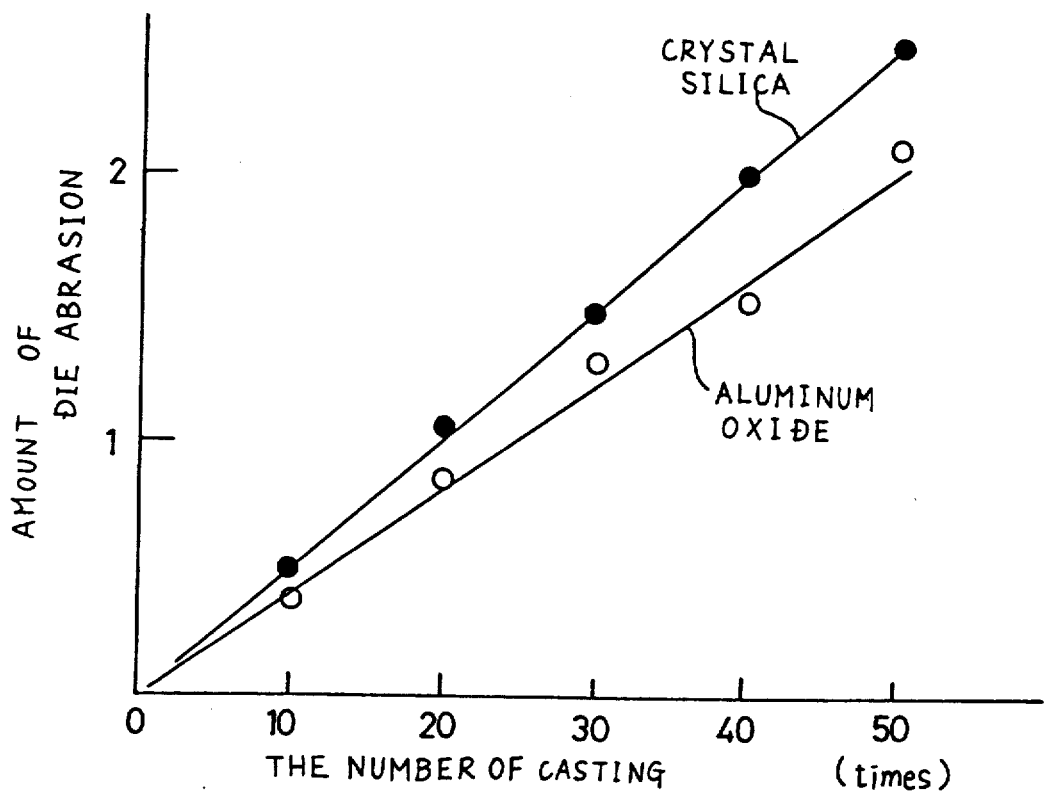
FIG. 6 shows the relationship between the number of casting and the amount of die abrasion.

Hardness of the aluminum oxide is 9 in Mohs' hardness. Hardness of the crystal silica is 6-7 in Mohs' hardness. When the resin including the aluminum oxide is injected into the die, in the manufacturing processes of the device, the amount of abrasion of the die is more than when the resin including the crystal silica is injected, because the aluminum oxide is harder than the crystal silica. FIGS. 4 and 5 show the relationships between corner angles of the fillers and the probability of distribution. The corner angle is defined as a minimum corner angle of a grain of the filler. The probability represents the percentage of the number of the fillers which have the corner angle of a certain range to the number of the all fillers. As shown in FIG. 4, according to the present embodiment, the corner angle of the aluminum oxide is more than 90°. As shown in FIG. 5, the corner angle of the crystal silica is equally distributed in the range of 50°-130°. FIG. 6 shows the relationship between the number of casting and the amount of die abrasion, wherein the aluminum oxide and the crystal silica have the corner angles shown in respectively FIGS. 4 and 5. The amount of die abrasion is defined as decreased weight of a resin-introducing pipe of the die which is made of SS45C. As understood from FIGS. 4-6, when the aluminum oxide having the corner angle of more than 90° is mixed in the molding resin 6, the amount of abrasion of the die is as little as when the crystal silica instead of the aluminum oxide is mixed in the molding resin.

Moreover, when the aluminum oxide having the corner angle of more than 90° is mixed in the molding resin 6, the amount of abrasion of an agitator is also reduced. Namely, in the manufacturing processes, the amount of abrasion of a propeller of the agitator is reduced, the propeller mixing the powder of the base material with the powder of the fillers, the aluminum oxide and the fused silica.

The corner angle is controlled by adjusting the manufacturing conditions of the filler, such as sintering temperature, sintering time.

Table 1 shows the results of measurement of composition, property and reliability of the molding resin in embodiments of the present invention and comparative samples. The embodiments (1) and (2), in which the aluminum oxide and the fused silica are mixed in the molding resin at the above-mentioned range of composition, have low stress and high thermal conductivity. The embodiments (1) and (2) have higher thermal shock-resistance and lower thermal resistance near the silicon chip than the comparative samples (1) and (2). According to the embodiments (1) and (2), the molding resin is increased the thermal conductivity and is reduced the stress at the same time. Therefore, even if the silicon chip in which the power transistor is formed and the silicon chip in which the control circuit is formed are integrally molded with such molding resins, the semiconductor element is hard to be inoperative and the passivation film is also hard to be cracked. The reliability of the semiconductor device according to the embodiments (1) and (2) is considerably improved.

TABLE 1

|  |  | EMBODIMENTS | | COMPARATIVE SAMPLES | |
|---|---|---|---|---|---|
|  |  | (1) | (2) | (3) | (4) |
| COMPOSITION (parts) | EPOXY RESIN | 42 | 42 | 42 | 42 |
|  | PHENOL RESIN | 31 | 31 | 31 | 31 |
|  | EPOXY RESIN MODIFIED WITH SILICONE | 16 | 16 | 16 | 16 |
|  | FUSED SILICA | 100 | 200 | 0 | 500 |
|  | ALUMINUM OXIDE | 400 | 400 | 0 | 0 |
|  | CRYSTAL SILICA | 0 | 0 | 500 | 0 |
| PROPERTY | MODULUS OF ELASTICITY E (Kg/mm$^2$) | 1400 | 1510 | 1550 | 1680 |
|  | THERMAL EXPANSION COEFFICIENT $\alpha$ ($10^{-5}$/°C.) | 1.6 | 1.3 | 2.1 | 1.1 |
|  | THERMAL CONDUCTIVITY $\lambda$ ($10^{-4}$ cal/cm °Cs.) | 59 | 54 | 52 | 16 |
|  | THERMAL STRESS (Kg/mm$^2$) | 2.24 | 1.96 | 3.26 | 1.85 |
| RELIABILITY | THERMAL SHOCK-RESISTANCE (−40° C. 160°, ∞) | 100 | 1000 | 50 | 1000 |
|  | THERMAL RESISTANCE (°C./W) | 3.5 | 4 | 4 | 10 |

Table 2 shows methods and conditions of the measurement of Table 1.

TABLE 2

| ITEMS | METHOD, CONDITION, etc. |
|---|---|
| MODULUS OF ELASTICITY E | JIS (Japanese Industrial Standard)-K-6911 |
| THERMAL EXPANSION COEFFICIENT $\alpha$ | THERMODILATOMETER MEASURED AT THE TEMPERATURE OF 60° C.-150° C. |
| THERMAL CONDUCTIVITY | THERMAL CONDUCTIVITY METER |
| THERMAL SHOCK-RESISTANCE | THENUMBER OF THERMAL CYCLING (−40° C. 160°, ∞) UNTIL THE PASSIVATION FORMED ON THE CHIP IS CRACKED AND THE ELECTRIC CHARACTERISTIC OF THE SEMICONDUCTOR ELEMENT CHANGES |
| THERMAL RESISTANCE | TEMPERATURE DIFFERENCE BETWEEN ON THE CHIP AND ON THE SURFACE OF THE MOLDING RESIN WHEN THE POWER TRANSISTOR HEATS |

As mentioned above, according to the present embodiment, the chips 2 and 3 are molded and sealed with the thermosetting resin including the aluminum a oxide and the fused silica. Therefore, the stress acting on the chips 2 and 3 is reduced because the thermal expansion coefficient of the resin becomes low due to the fused silica. At the same time the thermal conductivity is improved because fo the aluminum oxide.

Figure 7:
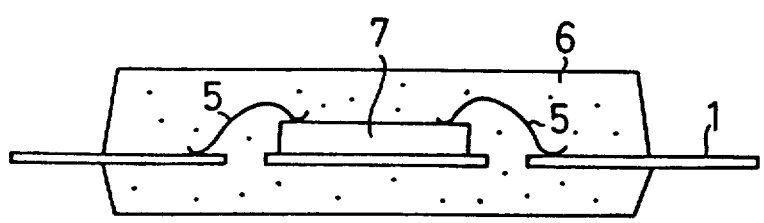
FIG. 7 is a sectional view of a resin-sealed semiconductor device of another embodiment.

The present invention has been described with reference to the above-mentioned embodiments, but the present invention is not limited to these embodiments and can be modified without departing from the spirit or concept fo the present invention, for example, as shown in FIG. 7, the power transistor and the control circuit may be formed in one silicon chip 7. In this case, although the size of the silicon chip 7 becomes relatively large, the stress and the thermal conductivity is improved like the above-mentioned embodiment.

What is claimed is:

1. A resin-sealed semiconductor device comprising:
   a lead frame;
   a silicon chip formed on said lead frame and electrically connected with said lad frame; and
   a thermosetting resin, arranged to seal at least a pat of said lead frame and said silicon chip, and consisting essentially fo a base resin, aluminum oxide and fused silica in predetermined proportions satisfying the following equation:

$$1.06X + y > 0.57,$$

where x is the percent volume of aluminum oxide and y is the percent volume of fused silica.

2. A resin-sealed semiconductor device according to claim 1, wherein a corner angle of said aluminum oxide is more than 90°.

3. A resin-sealed semiconductor device according to claim 1, wherein said base resin includes an epoxy resin, a phenol resin and an epoxy resin modified with silicone.

* * * * *